US012588297B2

(12) United States Patent
Eaglesham et al.

(10) Patent No.: US 12,588,297 B2
(45) Date of Patent: Mar. 24, 2026

(54) PHOTOVOLTAIC DEVICES INCLUDING AN INTERFACIAL LAYER

(71) Applicant: First Solar, Inc., Tempe, AZ (US)

(72) Inventors: David Eaglesham, Lexington, MA (US); Peter V. Meyers, Christiansted, VI (US)

(73) Assignee: First Solar, Inc., Pheonix, AZ (US)

( * ) Notice: Subject to any disclaimer, the term of this patent is extended or adjusted under 35 U.S.C. 154(b) by 310 days.

(21) Appl. No.: 17/335,874

(22) Filed: Jun. 1, 2021

(65) Prior Publication Data

US 2021/0288204 A1      Sep. 16, 2021

Related U.S. Application Data

(60) Continuation of application No. 15/682,718, filed on Aug. 22, 2017, now abandoned, which is a continuation of application No. 12/842,879, filed on Jul. 23, 2010, now abandoned, which is a division of application No. 12/236,730, filed on Sep. 24, 2008, now abandoned.

(60) Provisional application No. 60/974,971, filed on Sep. 25, 2007.

(51) Int. Cl.
*H10F 10/162* (2025.01)
*H10F 10/16* (2025.01)
*H10F 77/123* (2025.01)

(52) U.S. Cl.
CPC ........... *H10F 10/162* (2025.01); *H10F 10/16* (2025.01); *H10F 77/1233* (2025.01); *H10F 77/1237* (2025.01); *Y02E 10/543* (2013.01)

(58) Field of Classification Search
CPC ........... H01L 31/0296; H01L 31/02963; H01L 31/02966; H01L 31/072; H01L 31/073; H10F 10/16; H10F 10/162; H10F 77/1233; H10F 77/1237
See application file for complete search history.

(56) References Cited

U.S. PATENT DOCUMENTS

| | | | |
|---|---|---|---|
| 4,477,688 A | 10/1984 | Barnett et al. | |
| 4,536,607 A | 8/1985 | Wiesmann | |
| 4,568,792 A | 2/1986 | Mooney et al. | |
| 4,680,611 A | 7/1987 | Basol | |
| 4,710,589 A | 12/1987 | Meyers et al. | |
| 4,735,662 A | 4/1988 | Szabo et al. | |
| 4,959,106 A | 9/1990 | Nakagawa et al. | |
| 4,977,097 A | 12/1990 | Meyers et al. | |
| 5,393,675 A | 2/1995 | Compaan | |
| 5,472,910 A | 12/1995 | Johnson et al. | |
| 5,909,632 A | 6/1999 | Gessert | |
| 5,916,375 A | 6/1999 | Agui et al. | |
| 6,137,048 A | 10/2000 | Wu et al. | |
| 6,169,246 B1 | 1/2001 | Wu et al. | |
| 6,251,701 B1 | 6/2001 | McCandless | |

(Continued)

OTHER PUBLICATIONS

Definition of "film", accessed from https://www.merriam-webster.com/dictionary/film, accessed on Nov. 17, 2022.*

(Continued)

*Primary Examiner* — Golam Mowla
(74) *Attorney, Agent, or Firm* — MacMillan, Sobanski & Todd, LLC

(57) ABSTRACT

A photovoltaic cell can include an interfacial layer in contact with a semiconductor layer.

18 Claims, 3 Drawing Sheets

(56) References Cited

U.S. PATENT DOCUMENTS

| | | | |
|---|---|---|---|
| 6,548,751 | B2 | 4/2003 | Sverdrup et al. |
| 6,734,515 | B1 * | 5/2004 | Tadatomo ........... H01L 31/0304 |
| | | | 257/190 |
| 6,787,385 | B2 | 9/2004 | Barber et al. |
| 6,852,614 | B1 | 2/2005 | Compaan et al. |
| 7,888,594 | B2 * | 2/2011 | Lu ......................... H01L 31/048 |
| | | | 136/258 |
| 8,039,739 | B1 | 10/2011 | Capps et al. |
| 9,871,154 | B2 | 1/2018 | Duggal et al. |
| 2002/0185732 | A1 | 12/2002 | Ho et al. |
| 2003/0211646 | A1 | 11/2003 | Stanbery |
| 2004/0074531 | A1 | 4/2004 | Matsui et al. |
| 2005/0224111 | A1 | 10/2005 | Cunningham et al. |
| 2005/0257824 | A1 * | 11/2005 | Maltby ................. H01L 31/073 |
| | | | 136/252 |
| 2006/0104893 | A1 | 5/2006 | Shahriari et al. |
| 2006/0125098 | A1 | 6/2006 | Hoffman et al. |
| 2006/0186502 | A1 | 8/2006 | Shimotani et al. |
| 2006/0233211 | A1 | 10/2006 | Edmond et al. |
| 2006/0254677 | A1 | 11/2006 | McKinnell |
| 2007/0001581 | A1 | 1/2007 | Stasiak et al. |
| 2007/0034250 | A1 | 2/2007 | Dutta |
| 2007/0089784 | A1 | 4/2007 | Noh et al. |
| 2008/0092946 | A1 | 4/2008 | Munteanu et al. |
| 2008/0135089 | A1 | 6/2008 | Tsakalakos et al. |
| 2009/0133741 | A1 | 5/2009 | Higuchi et al. |
| 2009/0142880 | A1 * | 6/2009 | Weidman ........ H01L 31/022425 |
| | | | 438/98 |
| 2012/0012175 | A1 * | 1/2012 | Seo ................. H01L 31/022425 |
| | | | 257/E31.127 |

OTHER PUBLICATIONS

Trefny et al., "Polycrystalline Thin-Film, Cadmium-Telluride Solar Cells Fabricated by Electrodeposition Cells"—Final Subcontract Report, National Renewable Energy Laboratory (NREL), Oct. 1995.

Trefny et al., Polycrystalline Thin-Film, Cadmium-Telluride Solar Cells Fabricated by Electrodeposition—Final Technical Report, National Renewable Energy Laboratory (NREL), Jan. 1999.

Compaan et al., "High Efficiency Thin Film CdTe and a-Si Based Solar Cells", National Renewable Energy Laboratory (NREL), Oct. 2003.

Gessert et al., "Evolution of CdS/CdTe Device Performance During Cu Diffusion", National Renewable Energy Laboratory (NREL), Feb. 2005.

Viswanathan, "Study of Cu Free Back Contacts to Thin Film CdTe Solar Cells, dissertation", Dept. of Electrical Engineering, University of South Florida, Feb. 2004.

Written Opinion of International Searching Authority, dated Mar. 24, 2009, international application PCTUS2008/011030.

Extended European Search Report, dated Nov. 7, 2017, European application 08835400.6.

Examination Report, dated Aug. 20, 2018, European application 08835400.6.

English Translation of Chinese Office Action dated May 6, 2011, Chinese application 200880101446.6.

European Patent Office Result of Consultation, dated Nov. 14, 2019, Application No. 08835400.6.

Decision of the Examining Division, dated Dec. 19, 2019, European Patent Application No. 08835400.6.

First Examination Report and Search Report, received Jul. 2017, United Arab Emirates, Application No. UAE/P/0374/2010, filed Sep. 24, 2008.

Second Examination Report, dated Jul. 31, 2019, United Arab Emirates, Application No. UAE/P/0374/2010.

International Center for Patent Registration, United Arab Emirates, Examination Report, received Apr. 26, 2021, Application No. P374/2010.

International Center for Patent Registration, United Arab Emirates, Search Report, received Apr. 26, 2021, Application No. P374/2010.

Chinese Office Action, dated Apr. 18, 2012, Chinese application 200880101446.6.

* cited by examiner

Fig. 5A

| 550 |
|---|
| 503 |
| 560a |
| 502 |
| 501 |
| 540 |
| 530 |

Fig. 5B

| 550 |
|---|
| 503 |
| 502 |
| 560a |
| 501 |
| 540 |
| 530 |

Fig. 5C

| 550 |
|---|
| 503 |
| 560a |
| 502 |
| 560b |
| 501 |
| 540 |
| 530 |

PHOTOVOLTAIC DEVICES INCLUDING AN INTERFACIAL LAYER

CROSS-REFERENCE TO RELATED APPLICATIONS

This application is a continuation application which claims the benefit of U.S. application Ser. No. 15/682,718, filed on Aug. 22, 2017; a continuation application which claims the benefit of U.S. application Ser. No. 12/842,879, filed on Jul. 23, 2010; a divisional application which claims the benefit of U.S. application Ser. No. 12/236,730, filed on Sep. 24, 2008; which claims the benefit of U.S. Application 60/974,971, filed on Sep. 25, 2007. Each of the foregoing applications is expressly incorporated herein by reference for all purposes.

TECHNICAL FIELD

This invention relates to photovoltaic devices.

BACKGROUND

In general, photovoltaic devices can be composed of materials whose properties at an interface differ from the properties of the remainder of the material. An interface refers to the region near a free surface or grain boundary as well as to the region between two different materials. In particular electrical properties of a material at an interface can be affected by trapped charge, dipole layers and inter-diffusion. Properties of a material at an interface can also be affected by localized energy levels, i.e., energy levels that exist within a limited space (as opposed to energy bands). Localized energy levels are typically associated with impurities, intrinsic defects, or crystallographic defects at an interface.

SUMMARY

A photovoltaic device can include a transparent conductive layer on a substrate, a first semiconductor layer including a wide bandgap semiconductor, a second semiconductor layer having a surface, and an interfacial layer in contact with the second semiconductor layer, wherein the interfacial layer maintains a chemical potential of the second semiconductor layer at a controlled level.

The second semiconductor layer can include a CdTe. The second semiconductor layer can include an alloy of CdTe. The second semiconductor layer can include a CdTe alloy wherein Cd is at least partially replaced by Zn, Hg. Mg or Mn. The second semiconductor layer can include CdTe alloys wherein Te is at least partially replaced by S. Se or O.

The photovoltaic device can have an interfacial layer that maintains the chemical potential of Cd. The device can have chemical potential controlled within a region of the semiconductor proximate to the interface of the second semiconductor. The interfacial layer can be between the second semiconductor layer and a back electrode. The interfacial layer can be a third semiconductor layer.

The photovoltaic device can have a the semiconductor material that includes ZnTe, CdZnTe, $CuAlS_2$, $CuAlSe_2$, $CuAlO_2$, $CuGaO_2$, or $CuInO_2$. The interfacial material can include GeTe, CdTe:P, CdTe:N, NiAs or NbP.

A semiconductor layer, such as a CdTe layer can have a surface. The surface can include chemical bonds between Cd and an element from column VA of the periodic table. The surface can include chemical bonds between Cd and N, P, As, and Sb. The interfacial layer can be between the second semiconductor and the first semiconductor layer.

The first semiconductor layer can include a $SnO_2$, $SnO_2$:Zn, $SnO_2$:Cd, ZnO, ZnSe, GaN, $In_2O_3$, $CdSnO_3$, ZnS or CdZnS. The interfacial layer can be compound of Cd with one any of the chalcogenides including O, S, or Se. The interfacial layer can include a CdS.

The device can include a semiconductor having a surface including chemical bonds between Te and any of the elements from column IIIA of the periodic table. The device can include a semiconductor having a surface that includes chemical bonds between Te and B, Al, Ga, In, or Tl.

In some circumstances, the interfacial layer can be a material with a chemical formula $ABO_2$, wherein A is either Cu, Ag, Au, Pt or Pd and B is one of the trivalent metal ions Al, In, Cr, Co, Fe, Ga, Ti, Co, Ni, Cs, Rh, Sn, Y, La, Pr, Nd, Sm or Eu, or doped compositions thereof. In other circumstances, the second semiconductor layer can be less than 2 um thick. In other circumstances, the second semiconductor layer can be less than 1 um thick. The device can include an additional interfacial layer between a transparent conductive layer and a first semiconductor layer.

A method of manufacturing a photovoltaic device can include depositing a first semiconductor layer on a substrate, the first semiconductor layer including a wide bandgap semiconductor, depositing a second semiconductor layer over the first semiconductor layer, and depositing an interfacial layer to contact a second semiconductor layer, wherein the interfacial layer maintains the chemical potential of the second semiconductor layer at a controlled level.

In some circumstances, the interfacial layer can be deposited by sputtering. The interfacial layer can be deposited by atomic layer deposition. The interfacial layer can be deposited by selective ion layer adsorption and reaction deposition.

A system for generating electrical energy can include a transparent conductive layer on a substrate, a first semiconductor layer including a wide bandgap semiconductor, a second semiconductor layer, an interfacial layer in contact with a second semiconductor layer, wherein the interfacial layer maintains the chemical potential of the second semiconductor layer at a controlled level, a first electrical connection connected to the transparent conductive layer, and a second electrical connection connected to the back metal contact.

In some circumstances, a transparent conducting layer electrode can be replaced by a metallic electrode, and the metallic back electrode can be replaced by a transparent conducting layer electrode. In other circumstances, a system can further include a first electrode connected to the transparent conductive layer and a second electrode connected to the back metal contact. In other circumstances, a back metal electrode can be replaced by a transparent conductive layer, and the device can be used in tandem with another photovoltaic device.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 5A is a schematic of a photovoltaic device having multiple layers.

FIG. 5B is a schematic of a photovoltaic device having multiple layers.

FIG. 5C is a schematic of a photovoltaic device having multiple layers.

DETAILED DESCRIPTION

Figure 1:
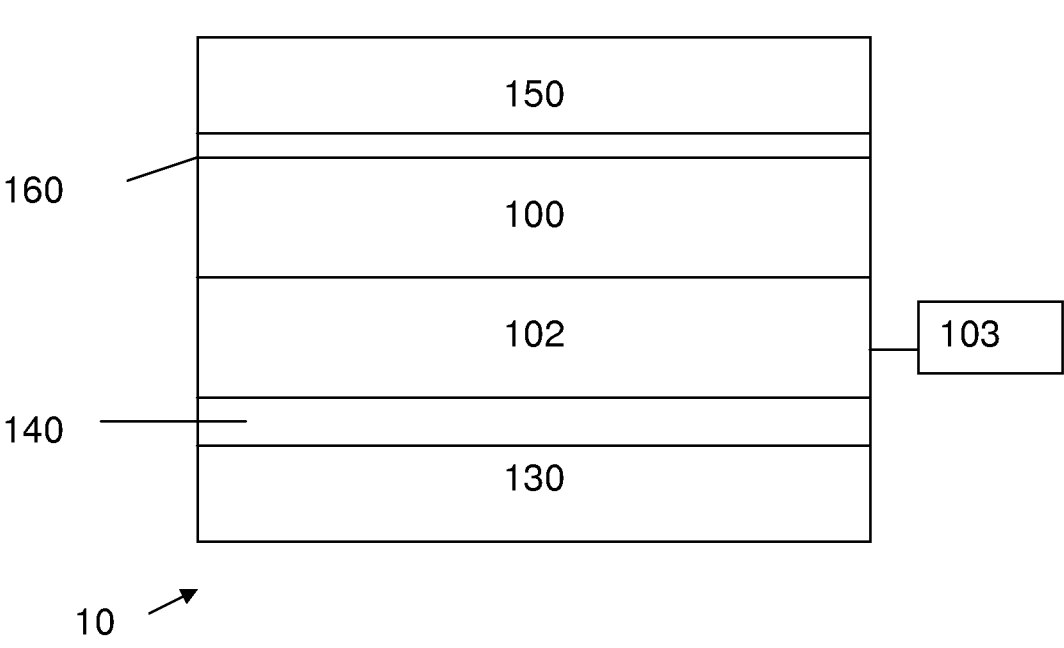
FIG. 1 is a schematic of a photovoltaic device having multiple layers.

In general, a photovoltaic device can include a first semiconductor layer including a wide bandgap semiconductor, a second semiconductor layer, and an interfacial layer in contact with the second semiconductor layer, wherein the interfacial layer maintains a chemical potential of the second semiconductor layer at a controlled level. A controlled level refers to a steady state chemical potential under conditions of illumination and bias both at the interface and within the region near the interface in a manner to optimize device performance. A controlled level of chemical potential cannot be achieved by passivating a grain boundary alone. Rather, one should try to specifically anticipate the impact of a modified chemical potential on the intrinsic defects within the region near the interface.

With CdTe photovoltaic devices, for example, defect formation energy and associated localized energy levels (the energy levels existing within a limited space) are characterized by chemical potential of those defects. The specification of a defect includes its charge state, i.e., $V_{Cd} \neq V^-_{Cd}$. The two defects are related by the chemical reaction $V_{Cd} + e^- \Leftrightarrow V^-_{Cd}$. The atomic structure and energy levels of the two defects typically differ. In this example, the relative concentration of the various defects is controlled by the law of mass action. The concentration of $V_{Cd}$ depends upon the chemical potential of Cd, and the concentration of electrons depends upon the electron quasi-Fermi level. The quasi-Fermi level within a device, in turn, depends on the intensity and spectral content of illumination, the voltage bias applied to the device, and the type and concentration of defects within the device. As with all chemical reactions, the rate of defect chemical reactions is a function of temperature. In some semiconductor materials the rate of chemical reaction at temperatures existing in a photovoltaic array field may be sufficient to produce changes in the defect concentration that in turn affect the power conversion efficiency of a photovoltaic device. Thus it is important that the materials and interfaces in a photovoltaic device be designed such that the relevant defect chemistry that exists under steady state conditions of illumination and bias found in the field be optimized to produce maximum power conversion efficiency in the field.

With CdTe photovoltaic devices, it is believed that the most relevant defect chemistry relates to a Cd sub-lattice. For example, for a Frenkel defect the chemical reaction is $Cd_{Cd} \Leftrightarrow V_{Cd} + Cd_i$. The cadmium atom on a cadmium atom site has a reversible reaction to become a vacant cadmium site plus a cadmium atom at an interstitial site.

In the vicinity of a surface, s, or a grain boundary, gb, the equivalent reactions become $Cd_{cd} \Leftrightarrow V_{cd} + Cd_s$ or $Cd_{cd} \Leftrightarrow V_{cd} + Cd_{gb}$. Cadmium interstitials are donors and cadmium vacancies are acceptors. If Cd atoms at grain boundaries or surfaces are also donors, then grain boundaries and surfaces would tend to be characterized by dipole layers or n-type grain boundaries or surfaces adjacent to p-type subsurface layers.

Photovoltaic devices consist of several layers. In one configuration layers of semiconductor material can be applied to a substrate with one layer serving as a window layer and a second layer serving as the absorber layer. One essential feature of a photovoltaic device is that a rectifying junction is formed between the two layers. In a typical configuration of a single junction photovoltaic device one of the semiconductors conducts electricity with positively charged holes and is therefore designated as a p-type material and the other semiconductor conducts electricity with negatively charged electrons and is therefore designated as an n-type material, and the junction of the two is designated a pn junction. Rectifying junctions can be formed between a wide variety of semiconductor materials including, for example, pn, pp$^+$, p$^-$p, nn$^+$, and n$^-$n. Photovoltaic devices in which the main rectifying junction is between two semiconductors are called "pn devices" or "single junction" devices.

When sunlight or other optical radiation with energy greater than the semiconductor bandgap is absorbed in the semiconductor layers photons are converted to electron-hole pairs. Electrons in p-type semiconductors and holes in n-type semiconductors are classified as "minority carriers". Photogenerated minority carriers move within the semiconductor layer in which they were created as driven by diffusion and drift until they either recombine with carriers of the opposite type within the semiconductor in which they were created or recombine at an interface of the semiconductor in which they were created or are collected by the other semiconductor layer. Recombination is a loss mechanism which reduces the photovoltaic power conversion efficiency in photovoltaic devices.

In one configuration of a single junction photovoltaic device a relatively wide bandgap semiconductor is used as one of the semiconductor layers. Use of a wide bandgap semiconductor layer has several potential advantages including its use as a "window" layer. When oriented with the window layer facing the sun, the window layer can allow the penetration of solar radiation to the absorber layer where photons are converted into electron-hole pairs. In a photovoltaic device electrons are collected by the n-type material and holes are collected by the p-type material. Once the carriers have been thus collected current flow in the opposite direction is prevented by the rectifying junction so that current is forced to go through an external electrical circuit. In this way optical power is converted into electrical power. The claimed device relates to methods to reduce electron-hole recombination which reduces the electrical current at maximum power of a photovoltaic device. Voltage at maximum power can also be reduced by space charges including interface dipoles that exist within a photovoltaic device. The claimed device reduces space charges that reduce maximum power voltage in a photovoltaic device. Thus claimed device improves the power conversion efficiency of a photovoltaic device by employing various interfacial layers as are described more fully below.

Some photovoltaic devices can use transparent thin films that are also conductors of electrical charge. The conductive thin films can be transparent conductive layers that contain a transparent conductive oxide (TCO), such as fluorine-doped tin oxide, aluminum-doped zinc oxide, or indium tin oxide. The TCO can allow light to pass through to a semiconductor window to the active light absorbing material and also serve as an ohmic electrode to transport photogenerated charge carriers away from the light absorbing material.

Additionally a back electrode can be formed on the back surface of a semiconductor layer. The back electrode can include electrically conductive material, such as metallic silver, nickel, copper, aluminum, titanium, palladium, chrome, molybdenum or any practical combination thereof.

An alternative configuration of photovoltaic devices consists essentially of three semiconductor materials and will be referred to as a "p-i-n device". The "i" stands for "intrinsic" and refers to a semiconductor material that in equilibrium has a relatively low number of charge carriers or either charge type or in which the net number of carriers, where "net" would be the absolute value of the concentration of p-type charge carriers minus the concentration on n-type carriers, is less than about $5 \times 10^{-14}$ cm$^{-3}$. Typically the primary function of the "i" layer is to absorb optical photons and convert them to electron-hole pairs. The photogenerated electrons and holes move within the "i' layer as driven by drift and diffusion until they either "recombine" with each other within the i-layer or at the p-i interface or at the i-n interface or until they are collected by the n and p layers, respectively.

In both the pn and p-i-n configurations, recombination of photogenerated charge carriers can be a loss mechanism that reduces the power conversion efficiency of photovoltaic devices. Recombination at an interface can be affected by factors including the type and concentration of energy levels at the interface, the electric field on both sides of the interface and any discontinuity in the valence or conduction band at the interface. Thus the interfaces between semiconductors and between metals and semiconductors have significant impact on device performance. Methods of mitigating negative impacts of interfaces on device performance include selection of heterojunction partners to minimize the lattice mismatch between the two materials, grading material composition from one heterojunction material to the other, and "passivating" the interface with oxygen, sulfur, hydrogen or other materials in order to tie up dangling bonds responsible for the mid-gap energy states. In addition researchers have used amphiphilic molecules at interfaces in order to alter electrical performance by creating a dipole layer on surfaces or at interfaces. Furthermore, in the absence of lattice mismatch the symmetry of the crystal lattice can be distorted simply by the existence of an interface between two materials of different electrical properties such that dipole layers form at the interface due to differences in the nature of chemical bonding between atoms of the heterojunction partners. While researchers have been aware of the impact of interfaces on device performance and have employed a wide range of approaches and specific solutions to mitigate their impact on device performance, the prior art does not address the impact of interfacial layers on the steady state chemical potential on the intrinsic and extrinsic defect chemistry of the semiconductor materials involved. Thus, in the absence of a controlled electrochemical potential within the semiconductor region adjacent to and including the interface under conditions of illumination and bias intrinsic and extrinsic defects may be created within that region whose effect is to lessen or negate the impact achieved through modification of the interfacial states alone. The claimed device not only addresses the impact of interfaces on device performance but also provides specific and innovative device structures that demonstrate control of the chemical potential under steady state conditions of illumination and bias and thereby enable photovoltaic devices to demonstrate improved power conversion efficiency.

In one example of CdTe-based PV devices, both rectifying and low resistance junctions with CdTe may include thin film interfacial layers designed to improve electrical performance of the devices. Interfacial layers include, for example, oxides between the CdTe and metal electrode of the MIS device and Te or Te-rich compounds such as $Cu_{2-x}Te$, $Cu_{2-x}O$ and $Sb_2Te_3$ at the CdTe metal electrode interface. Interfacial layers can be buffer layers that are typically produced by wet chemistry, sputter etching and sputter deposition, ebeam evaporation followed by thermal annealing, chemical bath deposition, or atomic layer deposition method, as described for example, by Marika Edoff at Uppsala University see "CIGS Thin Film Solar Cells, Uppsala University Final Report, Project no. 22213-1 Swedish Energy Agency, Project leader: Markia Edoff, Period 2005 Jan. 1-2006 Jun. 30.

State-of-the-art CdTe PV devices employ CdS as the wide bandgap n-type heterojunction partner to CdTe. CdS has an optical band gap of 2.42 eV, which can be too small to pass the full spectrum of solar insolation into the CdTe and that holes generated in the CdS are not collected by the CdTe. A thick CdS layer absorbs photons equivalent to approximately 6 mA/cm$^2$ out of approximately 30 mA/cm$^2$ that could be absorbed by the CdTe. State-of-the-art CdTe PV devices therefore attempt to minimize this current loss by using thin CdS that passes much of the light with energy above the CdS bandgap. The lower limit on CdS thickness has been attributed to the requirement that the heterojunction partner contain sufficient charge to balance the negative space charge in the CdTe. State-of-the-art n-type junctions to CdTe therefore contain a second high resistivity n-type "buffer" layer on the side of the CdS opposite to the CdTe. The n-type CdS can be covered with a high resistivity buffer layer that may contain doped or undoped transparent oxides such as $SnO_2$, $SiO_2$, $SnO_2$:Cd, $SnO_2$:Zn or $CdZnO_2$. The high resistivity buffer layer is believed both to add to the positive space charge and to mitigate effects of shunts through the CdS film. Much work has been directed toward the high resistivity "buffer" layer. Such buffer layers, are described, for example in U.S. Pat. No. 5,279,678, which is incorporated by reference herein. In any case, previous CdTe photovotaice devices consider CdS to be the n-type material forming the pn junction with CdTe in pn junction devices or to be the n-type material in p-i-n devices such as the CdS/CdTe/ZnTe structure, for example, where CdTe is the intrinsic layer and ZnTe is the p-type layer.

Much work has been directed toward making contacts to CdTe that enable low loss transport of holes from the CdTe. In principle, low loss hole transport could be achieved using metals with work functions similar to that of CdTe or using semiconductors whose work function is similar to CdTe and in addition have valence band maxima that are relatively close to that of CdTe. The valence band maximum (VBM) of CdTe is about 5.74 eV below the vacuum level, however, and no metals with such high work functions are currently known. In an attempt to mitigate the impact of the relatively low work function of available metals, researchers have employed an interfacial layer between the semiconductor layer and the back metal contact layer intended to enable hole transport by tunneling into the metal electrode.

Previous attempts to treat the surfaces of a CdTe typically employ heavy doping of the region near the metal electrode with p-type dopants such as copper, antimony, mercury or arsenic or employed various chemical or physical methods to produce Te-rich regions near the interface. Alternatively researchers have employed highly doped or degenerate p-type semiconductors such as $Cu_{2-x}Te$, $Cu_{2-x}O$, HgTe or $Sb_2Te_3$ in an attempt to make tunnel junctions between the CdTe and metal electrodes. Alternatively researchers have employed ZnTe as a low loss hole transport contact to CdTe. See, for example, U.S. Pat. Nos. 4,710,589 and 5,909,632, which are incorporated by reference herein. ZnTe can be a relatively wide bandgap semiconductor whose valence band maximum closely matches that of CdTe. In principle ZnTe has the added advantage that the positive step in the conduction band between CdTe and ZnTe would serve as an electron reflector for electrons tending to move from the CdTe into the ZnTe. In one example an undoped ZnTe film could be positioned adjacent to a CdTe layer and a second degenerately copper-doped ZnTe film could be positioned the opposite side of the undoped ZnTe film. With previous methods, it was unclear what role was played by the matching the VBM of the CdTe and ZnTe films and what role was played by the copper dopant. In any case, use of ZnTe did not improve the photovoltaic power conversion efficiency of devices employing other contacts described above.

Amphiphilic molecules can also be used at the interfaces to alter electrical performance of semiconductor devices by creating a dipole layer on surfaces or at interfaces. See for example, H. Haick, M. Avbrico, T. Ligonzo, R. Tung, and D. Cahen, "Controlling Semiconductor/Metal Junction Barriers by Incomplete, Nonideal Molecular Monolayers", J. Am. Chem. Soc. 2006, 128, pp 6854-6869, and David Cahen and co-authors G. Ashkenasy, D. Cahen, R. Cohen, A. Shanzer and A. Vilan, "Molecular Engineering of Semiconductor Surfaces and Devices", Acc. Chem. Res. 2002, 35, pp 121-128.

Note that even in the absence of lattice mismatch, the symmetry of a crystal lattice can be distorted by the existence of an interface between two materials of different electrical properties such that dipole layers form at the interface due to differences in the nature of chemical bonding between atoms of the heterojunction partners.

Previous methods have not included the use of high work function p-type TCOs to treat semiconductor layers, in part due to the difficulty in producing p-type TCOs with sufficiently high electrical conduction and optical transparency to play the role equivalent to that played by n-type TCOs in other semiconductor devices.

Thus, the interfaces between a first semiconductor layer and a second semiconductor layer, or between a semiconductor layer and a metal layer, have significant impact on device performance. Further, both rectifying and low resistance junctions with a semiconductor layer, such as a semiconductor layer including a CdTe, may include thin film interfacial layers designed to improve electrical performance of the devices. Interfacial layer can be deposited by wet chemistry, sputter etching and sputter deposition, e-beam evaporation followed by thermal annealing, chemical bath deposition, or atomic layer deposition method.

An improved photovoltaic device can include an interfacial layer that accounts for the chemical potential of a semiconductor, such as Cd, at the interface between a semiconductor layer, such as a CdTe layer, and a high work function or wide bandgap semiconductor. Whereas the previous devices specifically attempted to induce a p+ region in the vicinity of the p-type electrode or hole collector either by heavy doping or by lowering the chemical potential of Cd, an improved photovoltaic device can specifically maintain a high chemical potential of a semiconductor, such as Cd, to minimize formation of Cd vacancies and their associated defect complexes. The claimed device achieves improved electrical properties at interfaces through application of interface modifications and interfacial layers that control the steady state electrochemical potential at and near the interface at a level suitable for achieving high power conversion efficiency photovoltaic devices.

In general, a pn photovoltaic device includes a transparent conductive layer on a substrate, a first semiconductor layer including a wide bandgap semiconductor, a second semiconductor layer and an interfacial layer in contact with the second semiconductor layer, wherein the interfacial layer maintains a chemical potential of the second semiconductor layer at a controlled level.

An interfacial layer can be between the second semiconductor layer and a back metal contact. A first wide bandgap semiconductor can be a CdS, $SnO_2$, CdO, ZnO, ZnSe, GaN, $In_2O_3$, $CdSnO_4$, ZnS or CdZnS and the semiconductor may be either pure or doped with elements selected to achieve optimized electrical or optical properties. The interfacial layer can be a third semiconductor layer including a wide bandgap semiconductor. The interfacial layer can be a ZnTe, CdZnTe, $CuAlS_2$, $CuAlSe_2$, $CuAlTe_2$, $CuAlO_2$, $CuGaO_2$ or $CuInO_2$, any of which semiconductors can be doped or undoped.

With respect to interfaces in CdTe photovoltaic devices, for example, Te bonds readily with most metals, M, forming M-Te bonds that may, in turn, reduce the electrons available to form Cd—Te bonds. The "weakly bonded" Cd atoms in the vicinity of a CdTe-metal interface therefore move toward the surface of a CdTe layer and act as donors pinning the Fermi level at about 1 cV above the valence band maximum. In order to minimize M-Te bonding in favor of CdTe bonding, one can dope CdTe heavily p-type in the vicinity of the hole collector interface. In this manner, Cd-bonds are can be formed with Group V elements (e.g., N, P, As or Sb), which can serve as p-type dopants in bulk CdTe. Doping a CdTe interface with N or other group V elements is the physical limit of producing a highly doped, p+, interfacial layer adjacent to a CdTe layer, but doping of the interface in and of itself is not sufficient to ensure stable high power conversion efficiency. As can be seen in this description it is also necessary to consider the impact of the interfacial doping on the defect chemistry of the semiconductor material in the vicinity of the interface. As power conversion devices, photovoltaic devices operate under steady state conditions of illumination and bias as opposed to equilibrium conditions, thus the relevant defect chemistry for producing stable, high power conversion efficiency are conditions of illumination and bias that occur in the field. Thus the interfacial layers of the subject device control the steady state chemical potential both at the interface of a CdTe layer and within the region near the CdTe interface in a manner to optimize device performance under conditions of illumination and bias.

Referring to FIG. 1, a photovoltaic device 10 can include a transparent conductive layer 140 on a substrate 130, a first semiconductor layer 102 including a wide bandgap semiconductor 103, a second semiconductor layer 100 and an interfacial layer 160 in contact with a second semiconductor layer. The interfacial layer can be between the second semiconductor layer and a back metal contact 150. The interfacial layer can be sub-monolayer in thickness.

Figure 2:
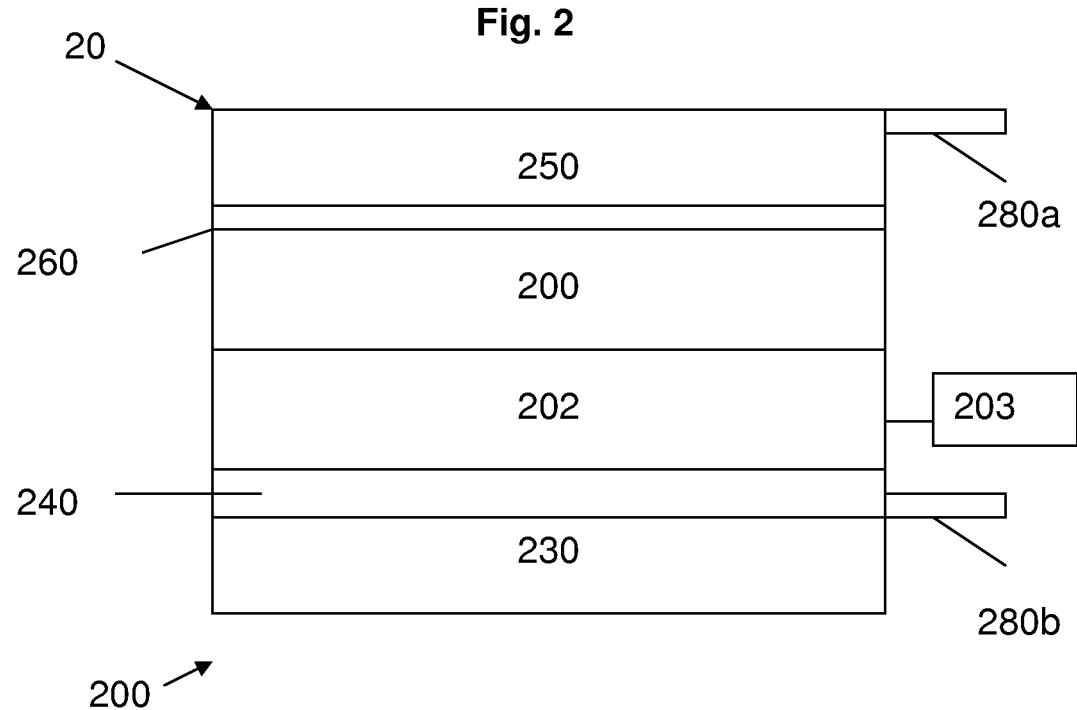
FIG. 2 is a schematic of a system for generating electrical energy.

Referring to FIG. 2, a system 200 for generating electrical energy can include a photovoltaic device 20 having a transparent conductive layer 240 on a substrate 230, a first semiconductor layer 202 including a wide bandgap semiconductor 203, a second semiconductor layer 200 and an interfacial layer 260 in contact with a second semiconductor layer. The interfacial layer can maintain a chemical potential of the second semiconductor layer at a controlled level in the interfacial region of the second semiconductor layer. An interfacial layer can be between a second semiconductor layer and a back metal contact 250. A system can further include a first electrode 280b connected to the transparent conductive layer and a second electrode 280a connected to the back metal contact.

Figures 3, 4:
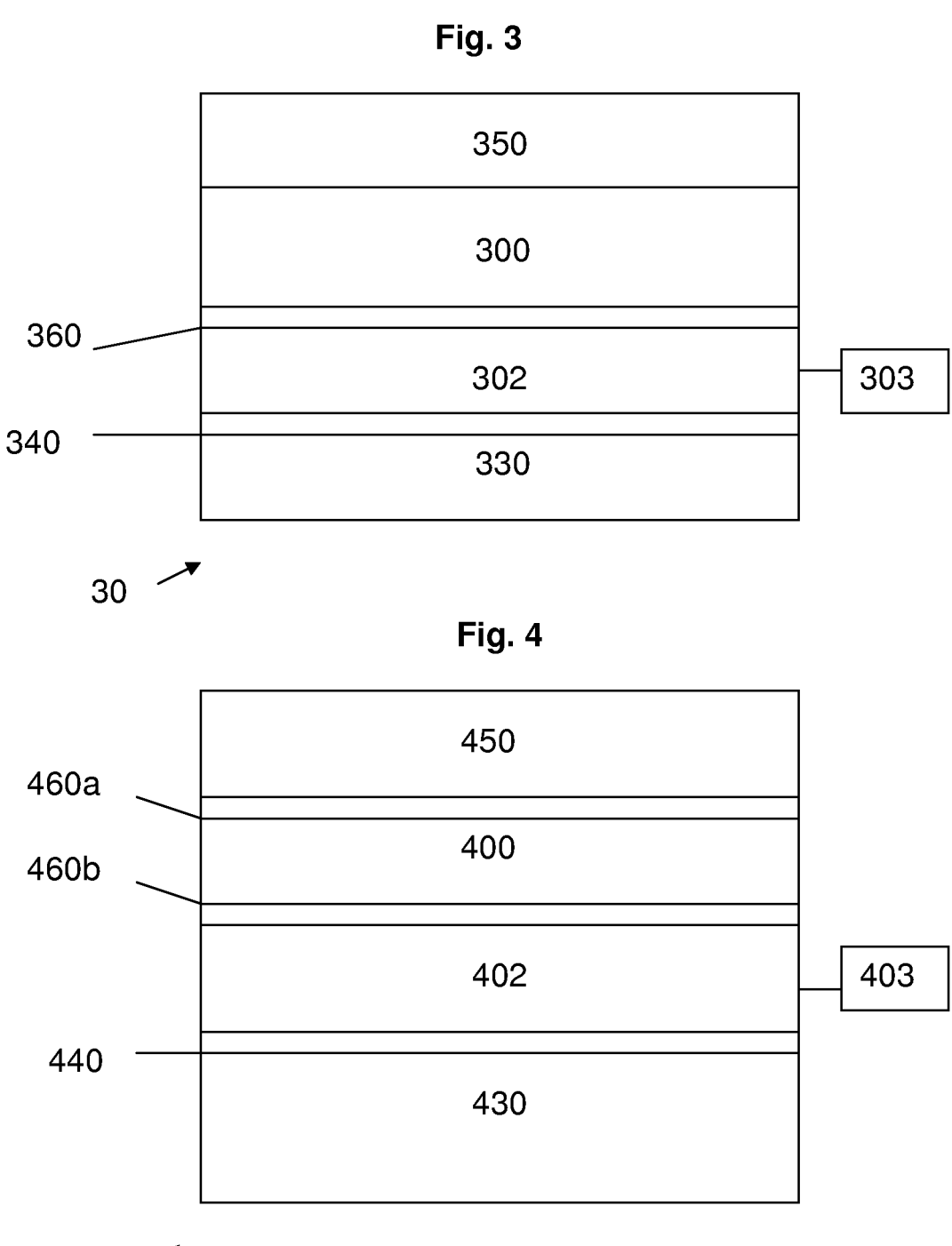
FIG. 3 is a schematic of a photovoltaic device having multiple layers.
FIG. 4 is a schematic of a photovoltaic device having multiple layers.

Referring to FIG. 3, a photovoltaic device 30 can include a transparent conductive layer 340 on a substrate 330, a first semiconductor layer 302 including a wide bandgap semiconductor 303, a second semiconductor layer 300 and an interfacial layer 360 in contact with a second semiconductor layer. The interfacial layer can maintain a chemical potential of the second semiconductor layer at a controlled level in the interfacial region of the second semiconductor layer. A photovoltaic device can also include a back metal contact 350 on a second semiconductor layer.

Referring to FIG. 4, a photovoltaic device 40 can include a transparent conductive layer 440 on a substrate 430, a first semiconductor layer 402 including a wide bandgap semiconductor 403, a second semiconductor layer 400, a first interfacial layer 460a, a second interfacial layer 460b, and a back metal contact 450. The first interfacial layer 460a can be in contact with the second semiconductor layer, between the second semiconductor layer and a back metal contact. The second interfacial layer 460b can be in contact with the second semiconductor layer, between the second semiconductor layer and the first semiconductor layer. The first and second interfacial layers can maintain a chemical potential of the second semiconductor layer at a controlled level in the interfacial region of the second semiconductor layer.

Figures 5A, 5B, 5C:
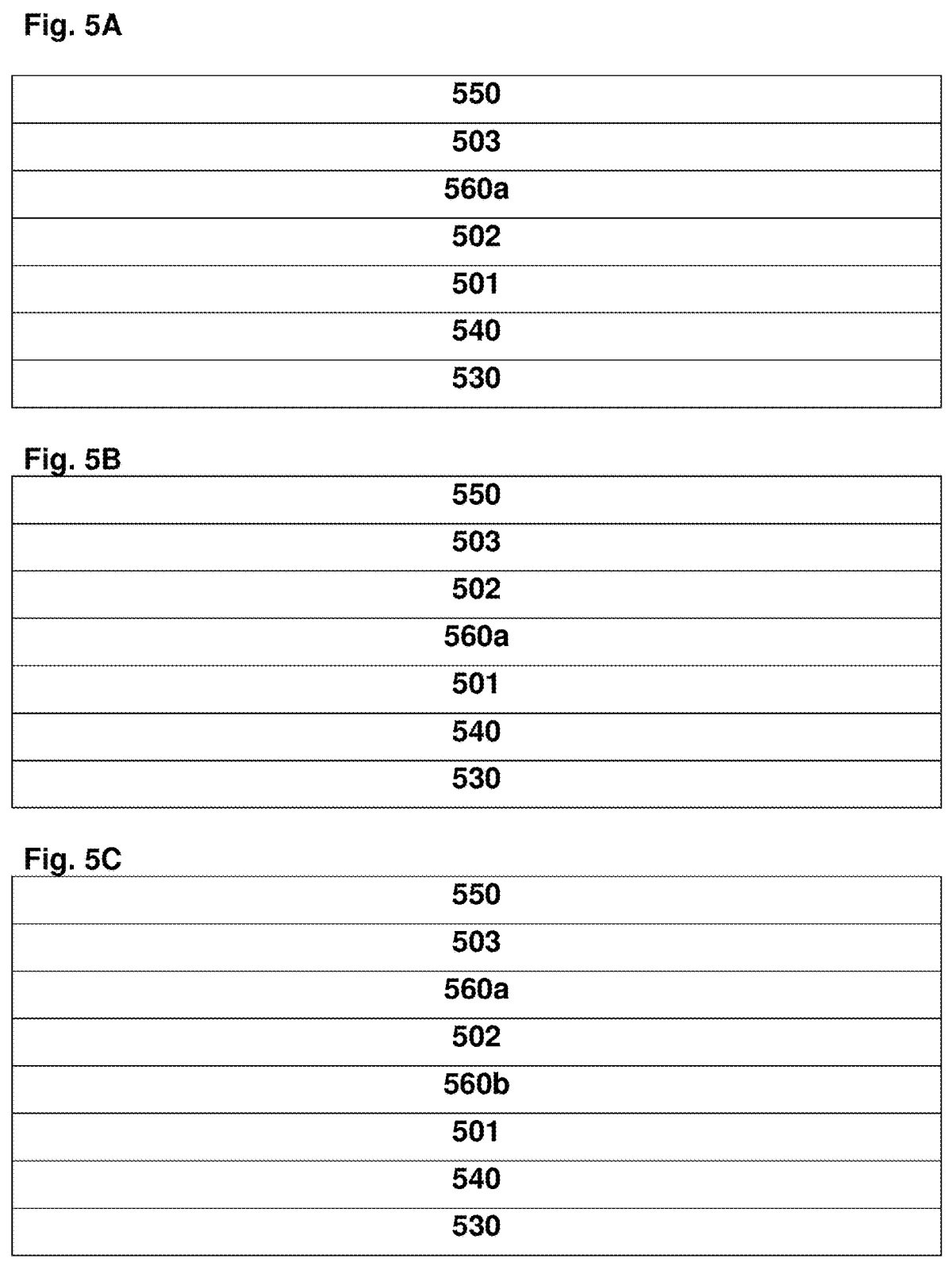

Referring to FIG. 5A, a photovoltaic device can include a transparent conductive layer 540 on a substrate 530, a first semiconductor layer 501 including a wide bandgap semiconductor, a second semiconductor layer 502 including a wide bandgap semiconductor, and a third semiconductor layer 503 including a wide bandgap semiconductor layer. A first interfacial layer 560a can be in contact with the second semiconductor layer 502, between the second semiconductor layer and a third semiconductor layer 503.

Referring to FIG. 5B, a photovoltaic device can include a transparent conductive layer 540 on a substrate 530, a first semiconductor layer 501 including a wide bandgap semiconductor, a second semiconductor layer 502 including a wide bandgap semiconductor, and a third semiconductor layer 503 including a wide bandgap semiconductor layer. A first interfacial layer 560a can be in contact with the second semiconductor layer 502, between the second semiconductor layer and a first semiconductor layer 501.

Referring to FIG. 5C, a photovoltaic device can include a transparent conductive layer 540 on a substrate 530, a first semiconductor layer 501 including a wide bandgap semiconductor, a second semiconductor layer 502 including a wide bandgap semiconductor, and a third semiconductor layer 503 including a wide bandgap semiconductor layer. A first interfacial layer 560a can be in contact with the second semiconductor layer 502, between the second semiconductor layer and a third semiconductor layer 503. An additional interfacial layer 560b can be in contact with the second semiconductor layer 502, between the second semiconductor layer and a first semiconductor layer 501.

A first semiconductor layer can include a wide bandgap semiconductor. A wide bandgap semiconductor has a bandgap greater than 2.4 eV, and can be an n-type semiconductor, such as CdS, $SnO_2$, CdO, ZnO, ZnSe, GaN, $In_2O_3$, $CdSnO_4$, ZnS, or CdZnS for example. The wide bandgap semiconductor can be selected to have minimal or slightly positive offset between a conduction band minima of CdTe and a conduction band minima of the wide bandgap semiconductor.

An interfacial layer can be between a second semiconductor layer and a back metal contact. The interfacial layer can include a GeTe, CdTe:P, CdTe:N, NiAs, or NbP. The interfacial layer can include a p-type semiconductor such as ZnTe, CdZnTe, $CuAlS_2$, $CuAlSe_2$, $CuAlTe_2$, $CuAlO_2$, $CuGaO_2$, or $CuInO_2$. More generally, the interfacial layer can be a material with a chemical formula $ABO_2$, wherein A is either Cu, Ag, Au, Pt or Pd and B is one of the trivalent metal ions Al, In, Cr, Co, Fe, Ga, Ti, Co, Ni, Cs, Rh, Sn, Y, La, Pr, Nd, Sm or Eu, or doped compositions thereof. Alternatively the interfacial layer can have a chemical composition $CuAlX_2$, wherein X is O, S, Se, or Te, or doped compositions thereof. The interfacial layer can maintain the chemical potential of cadmium at the interface and in a region adjacent to the interface at a controlled level under steady state conditions of illumination and bias.

The second semiconductor layer can include cadmium. The second semiconductor layer can include a CdTe. The second semiconductor layer can have a thickness of 2 microns or less. The second semiconductor layer can have a thickness of 1 micron or less.

A first semiconductor layer can include a III-V compound or alloys thereof. A III-V compound can be a material with a chemical formula XY, wherein X is selected from a group including boron, aluminum, gallium, indium, and thallium, and Y is selected from a group including nitrogen, phosphorus, arsenic, antimony, and bismuth. A III-V compound can be a gallium nitride, for example. The gallium nitride can be a gallium aluminum nitride.

A second semiconductor layer can include a II-VI compound or alloys thereof. A II-VI compound can be a material with a chemical formula X'Y', wherein X' is selected from a group including zinc, cadmium, magnesium, manganese, and mercury, and Y' is selected from a group including oxygen, sulfur, selenium, tellurium, and polonium. A II-VI compound can be a cadmium telluride, for example.

A heterojunction can be formed between the II-VI compound and the III-V compound. An interfacial layer can form a rectifying junction, such as a rectifying heterojunction between a II-VI compound and a III-V compound.

An interfacial layer can include an oxide or doped compositions thereof. The oxide can be a zinc oxide, for example. The oxide can be a mercury oxide. The oxide can be a tin oxide. The oxide can be a doped tin oxide. The doped tin oxide can be a zinc-doped tin oxide. The doped tin oxide can be a cadmium-doped tin oxide. The oxide can be a doped zinc oxide. The oxide can be a cadmium zinc oxide, copper oxide, iron oxide, magnesium oxide, nickel oxide, palladium oxide, silver oxide, strontium oxide, titanium oxide, vanadium oxide, for example.

A photovoltaic device can further include a first electrode connected to the transparent conductive layer and a second electrode connected to the back metal contact. The first electrode can be substantially transparent to light having an energy between 1 and 3 eV, and the second electrode can be largely transparent to light with energy below the bandgap of the second semiconductor, for example, between 1 and 1.8 cV.

A method of manufacturing a photovoltaic device can include depositing a first semiconductor layer on a substrate, the first semiconductor layer including a wide bandgap semiconductor, depositing a second semiconductor layer over the first semiconductor layer; and depositing an interfacial layer in contact with a second semiconductor layer.

The interfacial layer can maintain the chemical potential of the second semiconductor layer at a controlled level in the interfacial region of the second semiconductor layer. The interfacial layer can be between the second semiconductor layer and a back metal contact. The interfacial layer can be between the second semiconductor layer and the first semiconductor layer.

A method can include depositing an interfacial layer that can maintain the chemical potential of cadmium. The interfacial layer can be deposited by sputtering. The interfacial layer can be deposited by atomic layer deposition. The interfacial layer can be deposited by selective ion layer adsorption and reaction deposition.

A system for generating electrical energy can include a transparent conductive layer on a substrate, a first semiconductor layer including a wide bandgap semiconductor, a second semiconductor layer, an interfacial layer in contact with a second semiconductor layer. The interfacial layer can maintain the chemical potential of the second semiconductor layer at a controlled level in the interfacial region of the second semiconductor layer, a first electrical connection connected to the transparent conductive layer, and a second electrical connection connected to the back metal contact. The interfacial layer can be between the second semiconductor layer and a back metal contact.

A system for generating electrical energy can include a first electrode connected to the transparent conductive layer and a second electrode connected to the back metal contact. The first electrode can be substantially transparent to light having an energy between 1 and 3 eV, and the second electrode can be largely transparent to light with energy below the bandgap of the second semiconductor. A system for generating electrical energy can include two or more photovoltaic devices positioned in tandem.

An interfacial layer can be positioned on either side of a semiconductor layer or on both sides of a semiconductor layer. A semiconductor layer can include CdTe or an alloy of CdTe with Zn, Hg, Mn, or Mg, for example. Low resistance hole transport between a semiconductor layer and a metal contact or a semiconductor layer and another semiconductor layer can be achieved by using high work function materials or by other means well known by those versed in the art.

In one example, a photovoltaic device can have the following pn structure:

Example 1

| Metal electrode | Cr |
| --- | --- |
| Interfacial layer: Including a p-type semiconductor | $Cd_xZn_{1-x}Te$ or CdTe:N or $CuAlO_2$ |
| Second semiconductor layer | CdTe |
| Interfacial layer: Including an n-type semiconductor | CdS |
| First Semiconductor Layer: including a wide bandgap n-type semiconductor | $SnO_2$, or $SnO_2$:Zn or $SnO_2$:Cd |
| Transparent conductive layer | $SnO_2$:F, ITO or $Cd_2SnO_4$ |
| Substrate | Planar glass sheet |

In a second example a photovoltaic device can have a third semiconductor layer in contact with a second semiconductor layer:

Example 2

| Metal electrode | Cr |
| --- | --- |
| Third semiconductor layer: including a wide bandgap p-type semiconductor | ZnTe or $Cd_xZn_{1-x}Te$ or $CuAlO_2$ |
| Interfacial layer: Including a p-type semiconductor | CdTe:N |
| Second semiconductor layer | CdTe |
| Interfacial layer: Including an n-type semiconductor | CdS |
| First Semiconductor Layer: including a wide bandgap n-type semiconductor | $SnO_2$, or $SnO_2$:Zn, $SnO_2$:Cd |
| Transparent conductive layer | $SnO_2$:F, ITO or $Cd_2SnO_4$ |
| Substrate | Planar glass sheet |

A photovoltaic cell can have multiple layers. The multiple layers can include a bottom layer that can be a transparent conductive layer, a capping layer, a window layer, an absorber layer and a top layer. Each layer can be deposited at a different deposition station of a manufacturing line with a separate deposition gas supply and a vacuum-sealed deposition chamber at each station as required. The substrate can be transferred from deposition station to deposition station via a rolling conveyor until all of the desired layers are deposited. Additional layers can be added using other techniques such as sputtering. Electrical conductors can be connected to the top and the bottom layers respectively to collect the electrical energy produced when solar energy is incident onto the absorber layer. A top substrate layer can be placed on top of the top layer to form a sandwich and complete the photovoltaic cell.

The bottom layer can be a transparent conductive layer, and can be, for example, a transparent conductive oxide such as tin oxide or tin oxide doped with fluorine.

The bottom layer of a photovoltaic cell can be a transparent conductive layer. A thin capping layer can be on top of and at least covering the transparent conductive layer in part. The next layer deposited can be the first semiconductor layer, which can serve as a window layer and can be thinner based on the use of a transparent conductive layer and the capping layer. The next layer deposited can be the second semiconductor layer, which serves as the absorber layer. Other layers, such as layers including dopants, can be deposited or otherwise placed on the substrate throughout the manufacturing process as needed.

The transparent conductive layer can be a transparent conductive oxide, such as a metallic oxide like tin oxide, which can be doped with, for example, Zn or Cd. This layer can be deposited between the front contact and the first semiconductor layer, and can have a resistivity sufficiently high to reduce the effects of pinholes in the first semiconductor layer. Pinholes in the first semiconductor layer can result in shunt formation between the second semiconductor layer and the first contact resulting in a drain on the local field surrounding the pinhole. A small increase in the resistance of this pathway can dramatically reduce the area affected by the shunt.

The first semiconductor layer can serve as a window layer for the second semiconductor layer. The first semiconductor layer can be thinner than the second semiconductor layer. By being thinner, the first semiconductor layer can allow greater penetration of the shorter wavelengths of the incident light to the second semiconductor layer.

A number of embodiments have been described. Nevertheless, it will be understood that various modifications may be made without departing from the spirit and scope of the claimed device. For example, the semiconductor layers can include a variety of other materials, as can the materials used for the buffer layer and the capping layer. Accordingly, other embodiments are within the scope of the following claims.

What is claimed is:

1. A photovoltaic device comprising:
a transparent conductive layer on a substrate;
a first semiconductor layer including a wide bandgap semiconductor;
a second semiconductor layer, provided as a film and having a surface, wherein the second semiconductor layer includes a CdTe alloy wherein Te is at least partially replaced by Se or O; and
an interfacial layer in contact with the second semiconductor layer, wherein the interfacial layer is doped p+, wherein the interfacial layer is doped p+ with at least one of: nitrogen, phosphorus, arsenic, or antimony.

2. The photovoltaic device of claim 1, wherein the surface includes chemical bonds between Cd and N, P, As, or Sb.

3. The photovoltaic device of claim 1, wherein the interfacial layer is a third semiconductor layer.

4. The photovoltaic device of claim 1, wherein the interfacial layer includes ZnTe, CdZnTe, $CuAlS_2$, $CuAlSe_2$, $CuAlO_2$, $CuGaO_2$, or $CuInO_2$.

5. The photovoltaic device of claim 1, wherein the interfacial layer includes GeTe, CdTe:P, CdTe:N, NiAs, or NbP.

6. The photovoltaic device of claim 1, wherein the interfacial layer is between the second semiconductor layer and the first semiconductor layer.

7. The photovoltaic device of claim 1 in which the first semiconductor layer is $SnO_2$, $SnO_2$:Zn, $SnO_2$:Cd, ZnO, ZnSe, GaN, $In_2O_3$, $CdSnO_3$, ZnS, or CdZnS.

8. The photovoltaic device of claim 1 wherein the interfacial layer is a compound of Cd with any one of the chalcogenides.

9. The photovoltaic device of claim 1, wherein the surface includes chemical bonds between Te and any of the elements from column IIIA of the periodic table.

10. The photovoltaic device of claim 1, wherein the surface includes chemical bonds between Te and B, Al, Ga, In, or Tl.

11. The photovoltaic device of claim 1, wherein the interfacial layer is a material with a chemical formula $ABO_2$, wherein A is one of Cu, Ag, Au, Pt, or Pd, and B is one of the trivalent metal ions Al, In, Cr, Co, Fe, Ga, Ti, Co, Ni, Cs, Rh, Sn, Y, La, Pr, Nd, Sm, or Eu, or doped compositions thereof.

12. The photovoltaic device of claim 1, wherein the second semiconductor layer is less than 2 μm thick.

13. The photovoltaic device of claim 1, further comprising an additional interfacial layer between the transparent conductive layer and the first semiconductor layer.

14. The photovoltaic device of claim 1, wherein the interfacial layer includes an oxide.

15. The photovoltaic device of claim 1, wherein the wide bandgap semiconductor is n-type, has a bandgap greater than 2.4 eV, and has a conduction band minima with a positive offset compared to a conduction band minima of the second semiconductor layer.

16. The photovoltaic device of claim 1, further comprising:
a second transparent conductive layer, wherein the first semiconductor layer, the second semiconductor layer, and the interfacial layer, are positioned between the transparent conductive layer and the second transparent conductive layer, and the photovoltaic device is used in tandem with another photovoltaic device.

17. The photovoltaic device of claim 1, wherein the interfacial layer is doped p+ with nitrogen or arsenic.

18. A photovoltaic device comprising:
a transparent conductive layer on a substrate;
a first semiconductor layer including a wide bandgap semiconductor;
a second semiconductor layer, provided as a film and having a surface, wherein the second semiconductor layer includes a CdTe alloy wherein Te is at least partially replaced by Se or O;
an interfacial layer in contact with the second semiconductor layer, wherein the interfacial layer comprises ZnTe or CdZnTe, and wherein the interfacial layer is doped p+ with nitrogen or arsenic; and
a second transparent conductive layer, wherein the first semiconductor layer, the second semiconductor layer, and the interfacial layer, are positioned between the transparent conductive layer and the second transparent conductive layer, and the photovoltaic device is used in tandem with another photovoltaic device.

* * * * *